United States Patent [19]

Stevens

[11] 4,333,009
[45] Jun. 1, 1982

[54] OPTICAL POSITION TRANSDUCER

[75] Inventor: Curtis E. Stevens, Irvine, Calif.

[73] Assignee: Bertea Corporation, Irvine, Calif.

[21] Appl. No.: 101,586

[22] Filed: Dec. 10, 1979

[51] Int. Cl.$^3$ .............................................. H01J 3/14
[52] U.S. Cl. ................................ 250/237 G; 250/227
[58] Field of Search .............. 250/227, 231 SE, 237 G

[56] References Cited

U.S. PATENT DOCUMENTS 3,255,357 6/1966 Kapany et al. .
3,354,319 11/1967 Loewen et al. .
3,566,140 2/1971 Granqvist .
4,091,280 5/1978 Ellis et al. .
4,110,611 8/1978 Tann et al. .

FOREIGN PATENT DOCUMENTS 1540907 2/1979 United Kingdom .

Primary Examiner—David C. Nelms
Assistant Examiner—Darwin R. Hostetter
Attorney, Agent, or Firm—Gordon L. Peterson

[57] ABSTRACT

An optical position transducer comprising a coupler responsive to an input light pulse for providing a plurality of light pulses and a movable element movable along a path and having light transmitting regions and light obstructing regions. A first set of light pulse conductors conducts the light pulses, respectively, to a first set of locations closely adjacent the movable element with each of the light pulses being transmitted by the associated light pulse conductor to a different one of such locations. The light pulses are transmitted or obstructed by the movable element to provide a signal representative of the position of the movable element. A second set of light pulse conductors is positioned to conduct the light pulses transmitted by the movable element to a second location. At least some of the light pulses are delayed different lengths of time so that the light pulses from the second set of light pulse conductors can be transmitted as a light pulse train on a single light conductor.

22 Claims, 7 Drawing Figures

OPTICAL POSITION TRANSDUCER

BACKGROUND OF THE INVENTION

A position transducer is an apparatus which provides a signal which is representative of the position or the change of position of a movable element. Position transducers have many applications, such as, for example, in machine tools and in the feedback loop of a servo system for positioning aircraft flight control surfaces.

Many different kinds of position transducers are known. For example, one conventional electrical position transducer includes a ferromagnetic core and a coil, with the core being movable within the coil to vary the inductance of the coil as a function of the position of the movable element. This can be used to provide an electrical signal representative of the position of the movable element. Unfortunately, electrical position transducers are subject to various factors which adversely affect their performance, such as electromagnetic interference and R.F. interference.

SUMMARY OF THE INVENTION

This invention provides an optical position transducer which accurately and rapidly provides an optical signal representative of the position of a movable element. The optical transducer of this invention may be utilized to determine the absolute position and/or the change of position of many different kinds of movable elements.

The optical position transducer of this invention is adapted to receive an input light pulse and, in response to the input light pulse, it generates a plurality of light pulses. The transducer also includes a movable element movable along a path and having light transmitting regions and light obstructing regions. The movable element can be coupled to another member, the position of which varies and the position of which it is desired to ascertain.

To obtain a position signal representative of the position of the movable element, a first set of light pulse conductors conducts the light pulses to a first set of locations closely adjacent the movable element. Preferably, each of the light pulses is conducted by a separate conductor and is conducted to a different one of the first set of locations.

The light pulses from the first set of light pulse conductors are transmitted or obstructed by the movable element in accordance with the position of the movable element. The transmitted and obstructed pulses constitute a position signal representative of the position of the movable element. A second set of light pulse conductors is closely adjacent the movable element and is in a position to conduct the light pulses transmitted by the movable element to a second location.

The transducer includes delay means for causing at least some of the light pulses to be delayed different lengths of time. This enables the light pulses to be transmitted as a light pulse train on a single light conductor. Accordingly, the second set of light pulse conductors can be coupled to a single output light pulse conductor which conducts the output light pulse train to a remote location for decoding. If the light pulses were not delayed to provide the output light pulse train, a separate light pulse conductor would be required for conducting each light pulse from the movable element to a light pulse receiver, and a separate light pulse receiver would be required for each of the light pulses. This would add substantial cost and weight to the system, particularly when the transducer must be remotely located relative to the light receiver. Remotely locating the transducer is necessary, for example, in aircraft applications where the position of a remote flight control surface must be monitored.

The input light pulse can be suitably generated and conducted by a single input light pulse conductor to the transducer. The pulse providing means at the transducer may include a coupler which receives the input light pulse conductor and which is also coupled to the first set of light pulse conductors. Thus, the light pulse providing means also includes end portions of the first set of light pulse conductors which are received within the coupler.

The movable element may be of various sizes and configurations so long as it has the required light transmitting regions and light obstructing regions thereon. The light transmitting regions may take different forms and may include, for example, a transparent region, such as would be provided by an opening and/or solid transparent material. Alternatively, the light transmitting regions may include reflective regions on the movable element. The light obstructing regions, on the other hand, are preferably opaque and light absorbing.

The path along which the movable element moves can be of various configurations. For example, the movable element can move linearly and/or rotate.

The movable element may include a single plate having the light transmitting regions and light obstructing regions thereon. Alternatively, the movable element may include multiple plates, either or both of which may be movable with each of the plates having light transmitting regions and light obstructing regions. When multiple plates are utilized, the light transmitting regions and light obstructing regions may be arranged, for example, in a Moire pattern.

The arrangement of the light transmitting regions and light obstructing regions on the movable element defines a code. To avoid ambiguities in the signal provided by the code, the code is preferably of the type in which only a single bit changes as the movable element moves from one defined position to the next defined position. For example, a binary Gray code can be utilized.

The delay means preferably includes means for delaying the light pulses different lengths of time. The delaying function can occur before or after the movable element. The delay means is preferably provided in the first or second set of light pulse conductors and may include light pulse conductors of different lengths. One or more of the light pulses is not obstructed and is preferably not delayed, and this constitutes a mark or synchronizing pulse for the signal.

With this arrangement, the light pulse train constitutes a digital word having a number of bits which corresponds to the number of light pulses conducted to the movable element for transmission or obstruction. Each digital word represents a different position of the movable element. The light receiver is responsive to the digital word to provide a signal, such as an electronic signal which is representative of the position of the movable element.

The invention, together with further features and advantages thereof, may best be understood by reference to the following description taken in connection with the accompanying illustrative drawing.

DESCRIPTION OF THE PREFERRED EMBODIMENT

Figure 1:
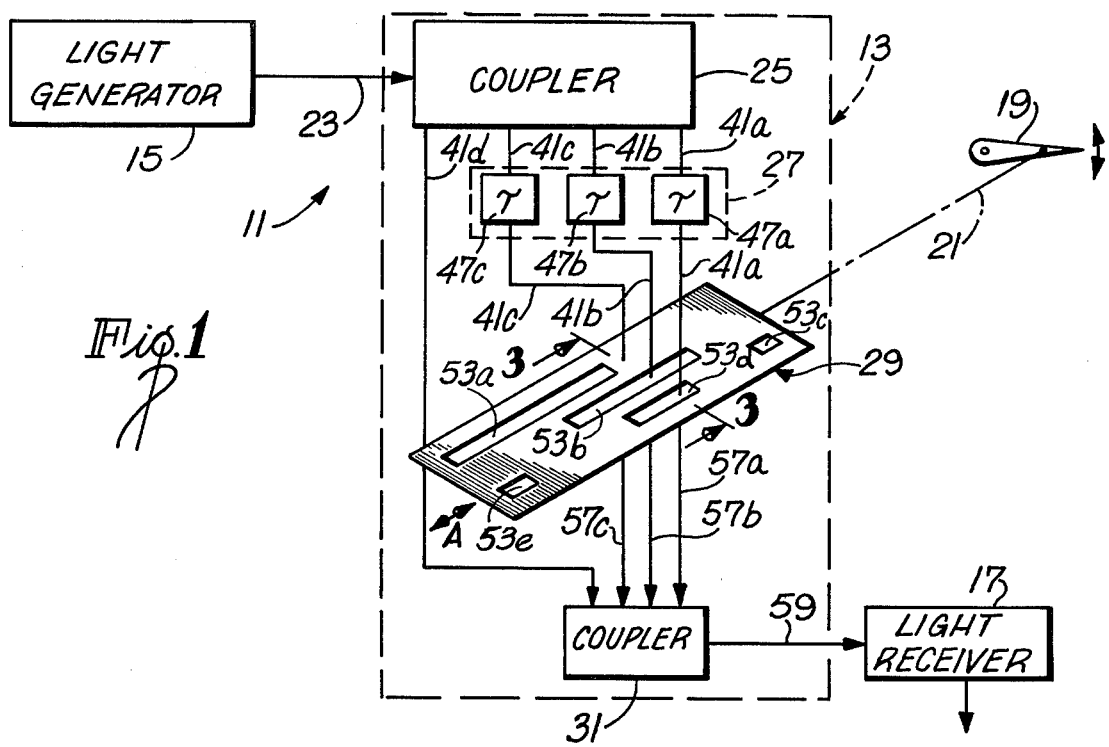
FIG. 1 is a schematic illustration of an optical position transducer system constructed in accordance with the teachings of this invention.

FIG. 1 shows an optical position transducer system 11 which includes an optical position transducer 13, a light generator 15 and a light receiver 17. The transducer system 11 is coupled to a movable member, the position of which it is desired to monitor. For example, the movable member may be an aircraft flight control surface 19 which is coupled to the transducer system 11 by a suitable mechanical linkage 21.

The light generator 15 can be any suitable light source which is capable of providing a very short duration input light pulse which may be, for example, of the order of ten nanoseconds. For example, the light generator may include a pulsed laser diode of the type manufactured by Laser Diode Laboratories as Part No. LD63F. A pulsed laser diode responds to a pulse of electric current to provide a single light pulse. Alternatively, an argon high-intensity lamp with a mechanical shutter could be used as the light generator 15.

The optical transducer 13 may be located remotely from the light generator 15, and in the aircraft example, the transducer 13 may be located close to the flight control surface 19, whereas the light generator may be located near the cabin of the aircraft. Accordingly, the input light pulse from the light generator 15 is conducted to the transducer 13 by a single input light pulse light conductor 23 which can have substantial length.

Figure 2:
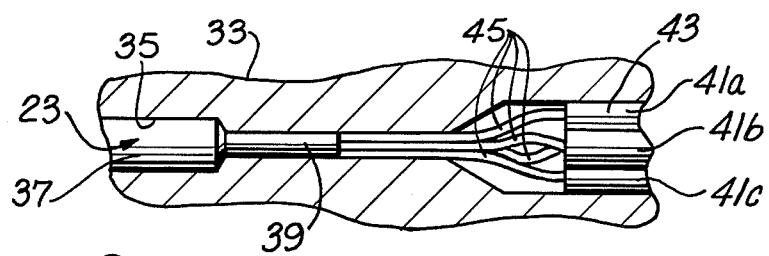
FIG. 2 is a fragmentary sectional view showing a preferred manner of generating a plurality of light pulses from a single light pulse.

The transducer 13 includes an input coupler 25, a delay controller 27, a movable element or obstructor 29 and an output coupler 31. The input coupler 25 receives the input light pulse from the conductor 23 and in response provides a plurality of light pulses. Although this function can be carried out in different ways, in the embodiment illustrated, the coupler 25 includes an opaque, metal body 33 (FIG. 2) having a passage 35 extending through it. The light conductor 23 is in the form of an optical fiber guide which includes the usual protective sheath 37 and the usual fiber guide 39. As shown in FIG. 2, the fiber guide 39 extends axially beyond the sheath 37, and the passage 35 is correspondingly configured so that the optical fiber guide is tightly received within the passage.

The transducer 13 also includes a first set of light pulse conductors 41a, 41b, 41c and 41d for conducting light pulses away from the coupler 25. The number of the light pulse conductors which is utilized will vary depending upon the number of positions which are to be determined for the movable element 29, with a greater number of the light conductors enabling a determination of more positions for the movable element. The illustrated number of the light conductors 41a–41d is merely illustrative.

Each of the light pulse conductors 41a–41d includes a sheath 43 and a fiber guide 45 with the fiber guide extending axially beyond the sheath. The light pulse conductors 41a–41d are snugly received within the opposite ends of the passage 35, and the fiber guides 45 extend axially beyond the sheaths 43 to bring the fiber guides 45 into end-to-end contact with the fiber guide 39. Because the fiber guides 45 are of smaller diameter than the fiber guide 39, the pulse of light from the fiber guide 39 will be received and conducted by each of the light pulse conductors 41a–41d. Accordingly, each of the light pulse conductors 41a–41d receives and conducts a light pulse.

The light pulses as received initially by the light pulse conductors 41a–41d occur essentially at the same time. To reduce the number of the light receivers 17 required and to reduce the number of the light conductors required to couple the transducer 13 to the light receiver 17, the delay controller 27 causes the light pulses to be delayed different lengths of time. The delay controller 27 includes delay elements 47a, 47b and 47c interposed in the light pulse conductors 41a–41c, respectively, for the purpose of delaying the light pulses in each of these light conductors different lengths of time. No delay element is provided in the light pulse conductor 41d, and so no additional delay for the light pulse in that conductor is provided.

Although each of the delay elements 47a–47c may take different forms, different lengths of the light pulse conductors 41a–41c can be used to accomplish the differential delay. For example, by making the light pulse conductor 41c twenty feet longer than the light pulse conductor 41d, the pulse conducted by the conductor 41c is delayed for approximately twenty nanoseconds longer than the pulse conducted by the conductor 41d. Similarly, by making the light pulse conductors 41b and 41a forty and sixty feet, respectively, longer than the conductor 41d, the pulses carried by these conductors are delayed forty and sixty nanoseconds, respectively, longer than the pulse conducted by the conductor 41d.

Figure 3:
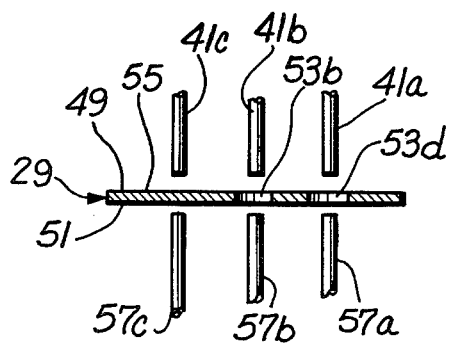
FIG. 3 is a sectional view taken generally along line 3—3 of FIG. 1 and illustrating one form of movable element.

The light pulse conductors 41a–41c conduct their respective light pulses to separate locations closely adjacent the movable element 29. Although the movable element 29 can be of different configurations, in the embodiment illustrated, it includes a thin, rigid plate of metal or other suitable material with the plate having opposite planar, parallel faces 49 and 51 (FIG. 3). The light pulse conductors 41a–41c terminate closely adjacent the face 49. Although the movable element 29 can move along different paths, in the form shown in FIG. 1, the movable element is mounted for movement along a linear path defined by the double arrow A in FIG. 1. The movable element 29 is driven along the path A by the flight control surface 19 and the linkage 21 so that the position of the movable element 29 varies with the position of the flight control surface 19.

The movable element 29 has light transmitting regions 53a–53e and light obstructing regions 55, with the light obstructing region 55 making up all of the area of the movable element 29 not consumed by the light transmitting regions. In the illustrated embodiment of the invention, each of the light transmitting regions 53a–53e is in the form of an opening in the movable element 29. The light obstructing regions 55 are opaque and preferably light absorbing regions.

There are three tracks or paths A, B, and C along the movable element 29, with the light transmitting region 53a being in the lefthand track A, the light transmitting region 53b being in the middle track B and the remaining light transmitting regions being aligned in the righthand track C. As shown by the binary Gray code to the left of the movable element 29 in FIG. 4, the light obstructing regions 55 designate a binary zero, and the light transmitting regions 53a–53e designate a binary one. Thus, the position encoded as 001 is designated on the movable element 29 by light obstructing regions 55 in the left and center tracks and the light transmitting region 53c in the righthand track. The other positions are similarly encoded on the movable element 29. As can be observed from FIG. 4, the binary Gray code results in only a single bit changing in moving from one detectable position to the next.

As shown in FIG. 1, a second set of light pulse conductors 57a, 57b and 57c is positioned to conduct the light pulses transmitted by the movable element 29 to the coupler 31. More particularly, the light pulse conductors 57a–57c, each of which may comprise an optical fiber guide, terminates closely adjacent the face 51 of the movable element 29 in alignment with the light pulse conductors 41a–41c, respectively. Accordingly, with the movable element 29 in the position shown in FIGS. 1 and 3, the light pulse conducted by the conductor 41a is transmitted by the movable element through the light transmitting region 53d to the light pulse conductor 57a. Similarly, the light pulse from the conductor 41b is transmitted by the aperture or light transmitting region 53b to the light pulse conductor 57b. However, the opaque light obstructing region 55 is interposed between the conductors 41c and 57c and so, consequently, the light pulse conducted by the conductor 41c is obstructed and cannot pass to the conductor 57c.

Figure 4:
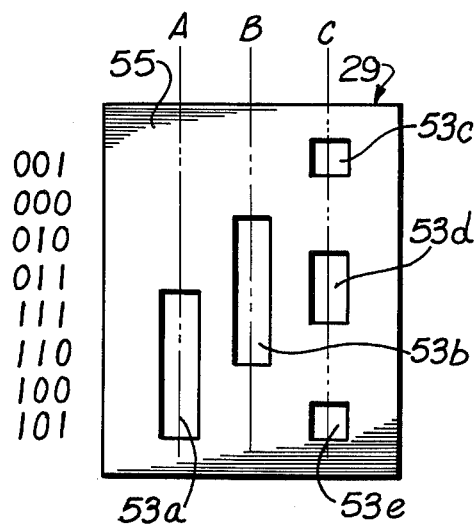
FIG. 4 is a plan view of the movable element.

Thus, in this position of the movable element, there is no pulse on the conductor 57c and there are light pulses on the conductors 57b and 57a, and this corresponds to the 011 position shown in FIG. 4. The presence or absence of the light pulses conducted by the conductors 41a–41c constitutes a position signal indicative of the position of the movable element 29.

The coupler 31 may be identical to the coupler 25, except that the coupler 31 receives the position signal in the form of a plurality of differentially delayed pulses from the conductors 57a–57c and 41d and provides the position signal in the form of a light pulse train or digital word on a single output light conductor 59 which conducts the pulse train to the light receiver 17. The light receiver 17 can be any apparatus which can respond to the position signal and provide another signal, such as an electrical signal representative of the position of the movable element. For example, a silicon PIN diode can be utilized for the light receiver 17.

Figure 5:
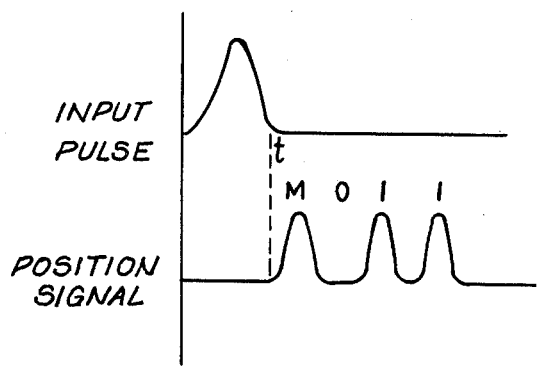
FIG. 5 is a plot of the input light pulse and the position signal.

With reference to FIG. 5, the input light pulse provided on the light pulse conductor 23 to the coupler 25 and the position signal or digital word provided on the output light conductor 59 are shown. The input pulse terminates at a time t which may be ten nanoseconds after the beginning of the input pulse. The position signal is comprised of a synchronizing or mark pulse M which is undelayed and which is conducted on the conductor 41d. The information portion of the position signal in the illustrative embodiment is a three-bit word and, for the position of the movable element 29, is defined as 011 with the 0 indicating the absence of a pulse and the one indicating the presence of a pulse. The separation in time of the bits making up the position signal 011 is the result of the delay elements 47a–47c. The delay between the time t and the initiation of the mark pulse is due to normal light transmission delays through light conductors 23 and 59. Because of the delays interposed by the delay elements 47a–47c, the position signal constitutes a pulse train which can be applied to the single output light conductor 59. Also, only a single light receiver 17 is necessary to decode the position signal.

Of course, the ends of the light conductors 41a–41c and 57a–57c which are adjacent the movable element 29 are suitably held in fixed positions. The light generator 15 can repeatedly provide input light pulses with a suitable delay time between each of the input light pulses. If the control surface 19 moves the movable element 29 to a new position, a different sequence of the pulses conducted by the light conductors 41a–41c will be transmitted to provide a different position signal which is indicative of the new position of the movable element 29.

Figure 6:
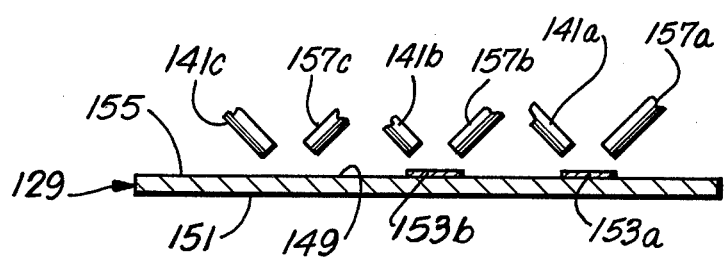
FIG. 6 is a sectional view similar to FIG. 3 showing an alternate form of movable element and associated light conductors.

FIG. 6 shows another form of movable element 129 and associated light pulse conductors 141a–141c and 157a–157c which can be used with the transducers of FIGS. 1–5 and 7. The movable element 129 is identical to the movable element 29 in all respects not specifically shown or described herein. Portions of the embodiment of FIG. 6 corresponding to portions of the embodiment of the FIGS. 1–5 are designated by corresponding reference characters preceded by the numeral "1."

The movable element 129 is identical to the movable element 29, except that the light transmitting regions are defined by reflectors rather than openings. The second set of light pulse conductors 157a, 157b and 157c is located on the same side of the movable element as the first set of light pulse conductors 141a, 141b, and 141c. As shown in FIG. 6, the light transmitting regions 153a and 153b each includes a reflector for reflecting the light pulse received by the conductors 141a and 141b to the light pulse conductors 157a and 157b respectively. The light pulse from the conductor 141c is not reflected to the conductor 157c because the obstructing region 155 absorbs the light pulse from the conductor 141c. Thus, in the position shown in FIG. 6, the position signal from the movable element 129 would be the same as the position signal for the movable element 29 in the position of FIG. 3.

Figure 7:
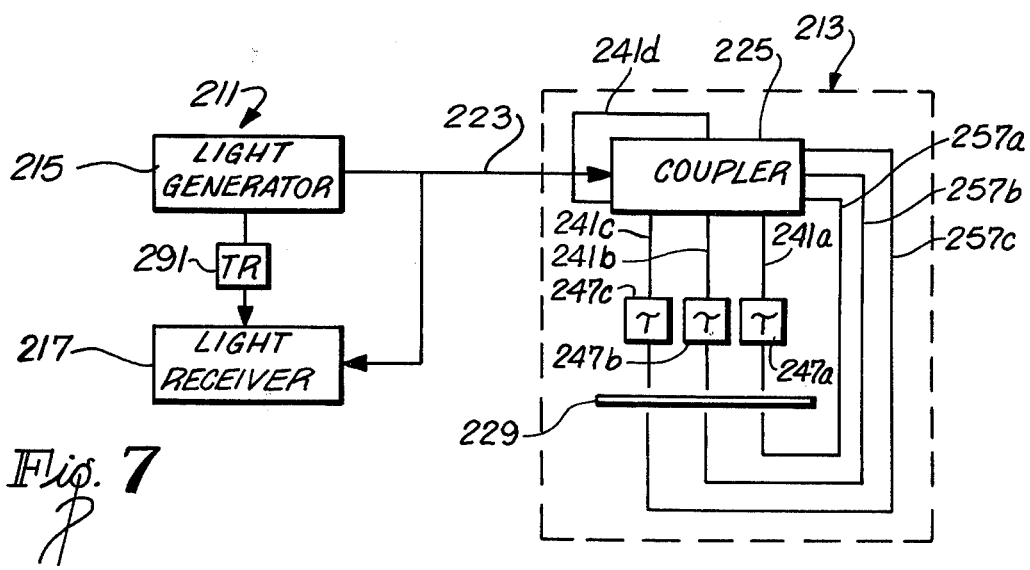
FIG. 7 illustrates a second form of optical position transducer system.

FIG. 7 shows an optical transducer system 211 which is identical to the optical transducer system 11 in all respects not shown or described herein. Portions of the optical transducer system 211 corresponding to portions of the optical transducer system 11 are designated by corresponding reference numerals preceded by the numeral "2."

The primary difference between the system 211 and the system 11 is that the light pulse conductor 223 is used sequentially to conduct the input light pulse from the light generator 215 to the optical transducer 213 and to conduct the position signal from the optical transducer 213 to the light receiver 217. The optical transducer 213 is identical to the optical transducer 13, except that the coupler 225 takes the place of the couplers 25 and 31 of the optical transducer 13. Thus, light pulse conductors 257a–257c lead from the movable element 229 back to the coupler 225 so that the signal transmitted thereby can be conducted by the light conductor 223 to the light receiver 217. The coupler 225 may be substantially identical to the construction shown in FIG. 2, except that the light conductors 257a–257c, as well as the light conductors 241a–241d have their end portions confronting and abutting the fiber guide 39. This means that incoming light pulses will be transmitted at different times in both directions on the light pulse conductors 241a–241d and 257a–257c. As an alternative to the above construction, the optical transducer 213 may have couplers corresponding to the couplers 25 and 31 of FIG. 1, and in this event, the light conductor 59 would conduct the position signal from the output coupler 31 back to the light conductor 223 rather than to the light receiver as in the embodiment of FIG. 1.

The system 211 also includes an appropriate transmitter-receiver switch 291 to turn the light receiver 217 off when the light generator 215 is providing the input pulse. For example, the switch 291 can turn the light receiver off in response to the same electrical signal which causes the light generator 215 to provide the input light pulse. The arrangement of FIG. 7 is particularly advantageous when the optical transducer must be located remotely from the light generator 215 and the light receiver 217. In this event, a single light conductor 223 can carry the input light pulse and the position signal. This can result in a substantial savings in the optic fiber guide which forms the light conductor 223 and, for aircraft applications, a consequent reduction in weight penalty.

Although exemplary embodiments of the invention have been shown and described, many changes, modifications and substitutions may be made by one having ordinary skill in the art without necessarily departing from the spirit and scope of this invention.

I claim:

1. An optical position transducer adapted to receive an input light pulse comprising:
    means responsive to the input light pulse for providing a plurality of light pulses;
    a movable element having light transmitting regions and light obstructing regions defining a position code;
    a first set of light pulse conductors for conducting at least a first set of the light pulses to a first set of locations closely adjacent the movable element whereby the first set of pulses is transmitted or obstructed by the movable element in accordance with the position of the movable element to provide a position signal representative of the position of the movable element;
    a second set of light pulse conductors positioned to conduct the light pulses transmitted by the movable element to a second location;
    delay means for causing at least some of the light pulses conducted by the second set of light pulse conductors to be delayed different lengths of time whereby at least some of the light pulses conducted by the second plurality of light pulse conductors can be transmitted from the optical position transducer as a light pulse train on a single light conductor; and
    each of said sets of light pulse conductors including a plurality of light pulse conductors.

2. An optical position transducer as defined in claim 1 wherein said providing means includes a light coupler adapted to receive the input light pulse and one end portion of said first set of light pulse conductors, said one end portion of said first set of light pulse conductors being received within said light coupler.

3. An optical position transducer as defined in claim 1 wherein at least one of said light transmitting regions is a light reflective region on said movable element.

4. An optical position transducer as defined in claim 1 wherein said movable element includes a plate which is movable along a path, said plate having said light transmitting regions and said light obstructing regions thereon.

5. An optical position transducer as defined in claim 1 including means for drivingly coupling said movable element to an aircraft flight control surface.

6. An optical position transducer as defined in claim 1 wherein said delay means includes the light pulse conductors of one of said sets of light pulse conductors being of different lengths to thereby delay the light pulses transmitted thereby different amounts.

7. An optical position transducer adapted to receive an input light pulse comprising:
    means responsive to the input light pulse for providing a plurality of light pulses;
    a movable element movable along a path and having light transmitting regions and light obstructing regions defining a position code;
    a first set of light pulse conductors for conducting at least a first set of said light pulses, respectively, to a first set of locations closely adjacent the movable element with each of said first set of light pulses being transmitted by the associated light pulse conductor to a different one of said locations of said first set of locations whereby the first set of pulses is transmitted or obstructed by the movable element in accordance with the position of the movable element to provide a position signal representative of the position of the movable element along said path;
    a second set of light pulse conductors closely adjacent the movable element and positioned to receive the light pulses, respectively, transmitted by the light transmitting regions of the movable element and to conduct such light pulses to a second location;
    delay means associated with at least one of said sets of light pulse conductors for delaying at least some of the light pulses different lengths of time whereby at least some of the light pulses conducted by the second set of light pulse conductors are delayed different lengths of time and can be transmitted from the second location as a light pulse train on a single light conductor; and
    each of said sets of light pulse conductors including a plurality of light pulse conductors.

8. An optical position transducer as defined in claim 7 wherein said movable element includes a movable plate having said light transmitting regions and said light obstructing regions thereon, said light transmitting regions including a plurality of transparent regions and said light obstructing regions including a plurality of opaque regions, said first set of locations being on one side of said plate and said second set of light pulse conductors having end portions aligned, respectively, with said first set of light pulse conductors and being on the opposite side of said plate from said first set of light pulse conductors.

9. An optical position transducer as defined in claim 7 including a bypass light pulse conductor for conducting at least one of said pulses from said providing means to said second location to provide said one pulse at said second location regardless of the position of the movable element along said path.

10. An optical position transducer as defined in claim 7 wherein said delay means includes at least some of the light pulse conductors of one of said sets of light pulse conductors being of different lengths.

11. An optical position transducer as defined in claim 7 wherein said light transmitting and light obstructing regions are arranged on said movable element to define a binary code in which each position of the movable element which is to be detected by the optical position transducer is defined by a digital word comprising a plurality of bits and only one of said bits changes between any two of said positions which are contiguous.

12. An optical position transducer system comprising:
means for generating an input light pulse;
input light pulse conducting means for conducting the input light pulse from the input light pulse generating means;
means coupled to said input light pulse conductor and responsive to the input light pulse for providing a plurality of light pulses;
a movable element movable along a path and having light transmitting regions and light obstructing regions defining a position code;
a first set of light pulse conductors for conducting the light pulses to a first set of locations closely adjacent the movable element whereby the pulses are transmitted or obstructed by the movable element in accordance with the position of the movable element to provide a position signal representative of the position of the movable element;
a second set of light pulse conductors positioned to conduct the light pulses transmitted by the movable element to a second location;
each of said sets of light pulse conductors including a plurality of light pulse conductors;
delay means for causing at least some of the light pulses to be delayed different lengths of time whereby at least some of the light pulses conducted by the second set of light pulse conductors are delayed different lengths of time;
means for receiving the light pulses from the second set of light pulse conductors and combining such light pulses as an output pulse train;
light conducting means for transmitting said output pulse train; and
means responsive to the output pulse train to provide a signal representative of the position of the movable element.

13. An optical position transducer system as defined in claim 12 wherein said input light pulse conducting means and said output pulse train light conducting means comprise a fiber optics cable utilized for transmitting both the input light pulse and the output pulse train.

14. An optical position transducer system as defined in claim 12 wherein said providing means and said receiving means include a single light coupler which is responsive to the input light pulse for providing the plurality of light pulses and which receives the light pulses from the second set of light pulse conductors and combines such light pulses as the output pulse train.

15. An optical position transducer adapted to receive an input light pulse comprising:
means responsive to the input light pulse for providing a plurality of light pulses;
a movable element having first regions and light reflective regions with said first regions and said reflective regions having different reflective properties, said regions being arranged on the movable element to define a position code;
light pulse conductor means including a plurality of light pulse conductors for conducting light pulses to the movable element and for conducting the light pulses reflected by the reflective regions away from the movable element, the reflecting of light pulses into the light pulse conductor means being a function of the position of the movable element; and
delay means for causing at least some of the light pulses conducted by the light pulse conductor means to be delayed different lengths of time whereby at least some of the light pulses conducted by the light pulse conductor means can be transmitted from the optical position transducer as a light pulse train on a single light conductor.

16. An optical position transducer as defined in claim 15 wherein said providing means includes a light coupler adapted to receive the input light pulse and one end of at least some of said light pulse conductors, said coupler receiving the reflected light pulses from the light pulse conductor means and combining such reflected light pulses to form said output pulse train.

17. An optical position transducer as defined in claim 15 wherein said delay means is located in said light pulse conductor means.

18. An optical position transducer as defined in claim 15 wherein said delay means includes said light pulse conductors being of different lengths to thereby delay the light pulses transmitted thereby different lengths of time.

19. An optical position transducer as defined in claim 18 wherein said providing means includes a light coupler adapted to receive the input light pulse and one end portion of at least some of said light pulse conductors, said coupler receiving the reflected light pulses from the light pulse conductor means and combining such reflected light pulses to form said output pulse train.

20. An optical position transducer system comprising:
means for generating an input light pulse;
a first light pulse conductor for conducting the input light pulse from the input light pulse generating means;
first means coupled to said first light pulse conductor and responsive to the input light pulse for providing a plurality of light pulses;
a movable element movable along a path and having reflective regions and first regions with said first regions and said reflective regions having different reflective properties, said regions being arranged to define a position code;
light pulse conductor means including a plurality of light pulse conductors for conducting light pulses to the movable element and for conducting the light pulses reflected by the reflective regions away from the movable element, the reflecting of light pulses into the light pulse conductor means being a function of the position of the movable element;
delay means for causing at least some of the light pulses to be delayed different lengths of time whereby at least some of the light pulses conducted by the light pulse conductor means are delayed different lengths of time;

second means for receiving the reflected light pulses from the light pulse conductor means and combining such reflected light pulses as an output pulse train on the first light pulse conductor whereby the first light pulse conductor transmits said output pulse train; and means responsive to the output pulse train to provide a signal representative of the position of the movable element.

21. An optical position transducer system as defined in claim 20 wherein said first and second means include a single light coupler responsive to the input light pulse for providing the plurality of light pulses and for receiving the reflected light pulses from the light pulse conductor means and combining such light pulses to form said output pulse train.

22. An optical position transducer as defined in claim 15 wherein said reflective regions are more reflective than said first regions.

* * * * *